United States Patent
Kuri et al.

(10) Patent No.: US 9,636,692 B2
(45) Date of Patent: May 2, 2017

(54) LIQUID METAL TARGET FORMING APPARATUS

(71) Applicants: MITSUBISHI HEAVY INDUSTRIES MECHATRONICS SYSTEM, LTD., Kobe-shi, Hyogo (JP); OSAKA UNIVERSITY, Suita-shi, Osaka (JP)

(72) Inventors: Syuhei Kuri, Kobe (JP); Izuru Matsushita, Kobe (JP); Hiroshi Horiike, Suita (JP); Eiji Hoashi, Suita (JP); Isao Murata, Suita (JP); Sachiko Suzuki, Suita (JP); Itsuro Kato, Suita (JP)

(73) Assignees: MITSUBISHI HEAVY INDUSTRIES MECHATRONICS SYSTEMS, Kobe-shi, Hyogo (JP); OSAKA UNIVERSITY, Suita-shi, Osaka (JP)

( * ) Notice: Subject to any disclaimer, the term of this patent is extended or adjusted under 35 U.S.C. 154(b) by 949 days.

(21) Appl. No.: 13/779,017

(22) Filed: Feb. 27, 2013

(65) Prior Publication Data

US 2013/0181073 A1    Jul. 18, 2013

(30) Foreign Application Priority Data

Sep. 30, 2011    (JP) .................... 2011-218633

(51) Int. Cl.
*H01J 35/08*    (2006.01)
*B05B 1/02*    (2006.01)
(Continued)

(52) U.S. Cl.
CPC ............ *B05B 1/02* (2013.01); *B29C 47/0004* (2013.01); *G03F 7/70033* (2013.01); *H05G 2/003* (2013.01); *H05G 2/008* (2013.01)

(58) Field of Classification Search
CPC ........ G21C 3/52; B01D 19/0021; G21K 5/04; G21K 5/08; G21K 5/10; H05H 3/06;
(Continued)

(56) References Cited

U.S. PATENT DOCUMENTS

| | | | | |
|---|---|---|---|---|
| 3,993,910 | A | * 11/1976 | Parkin et al. ............ | H05H 6/00 376/108 |
| 4,953,191 | A | * 8/1990 | Smither et al. ......... | H01J 35/08 378/126 |
| 2010/0195781 | A1 | * 8/2010 | Paul et al. ............... | H05H 6/00 376/185 |

FOREIGN PATENT DOCUMENTS

| | | |
|---|---|---|
| JP | 7-249498 A | 9/1995 |
| JP | 8-148820 A | 6/1996 |

(Continued)

OTHER PUBLICATIONS

Kondou et al., "IFMIF experimental study related to liquid metal lithium target flow", J. Plasma Fusion Res., vol. 84, No. 9, 2008, pp. 600-605 (w/ English translation).

(Continued)

*Primary Examiner* — Arthur O Hall
*Assistant Examiner* — Alexander Valvis
(74) *Attorney, Agent, or Firm* — Westerman, Hattori, Daniels & Adrian, LLP

(57) ABSTRACT

There is provided a liquid metal target forming apparatus, including a nozzle that forms a liquid metal target in space, which is irradiated with a proton beam, by ejecting liquid metal thereto. A portion where a region that receives a proton beam of the liquid metal target is formed in a discharge port of the nozzle has a concavo-convex shape.

7 Claims, 6 Drawing Sheets

(51) Int. Cl.
*H05G 2/00* (2006.01)
*G03F 7/20* (2006.01)
*B29C 47/00* (2006.01)

(58) Field of Classification Search
CPC .... G03F 7/70033; H05G 2/003; H05G 2/005; H05G 2/006; H05G 2/008
USPC .......................... 239/601, 559, 567; 451/102
See application file for complete search history.

(56) References Cited

FOREIGN PATENT DOCUMENTS

| | | | | | |
|---|---|---|---|---|---|
| JP | 08148820 | * | 6/1996 | ............... | H05K 3/34 |
| JP | 11-273896 A | | 10/1999 | | |
| JP | 2001033600 A | * | 2/2001 | ............... | G21K 5/08 |
| JP | 2002-064000 A | | 2/2002 | | |
| JP | 2009-47432 A | | 3/2009 | | |

OTHER PUBLICATIONS

Decision to Grant a Patent dated Aug. 11, 2015, issued in counterpart Japanese Patent Application No. 2011-218633, with English translation (5 pages).

Office Action dated Jun. 2, 2015, issued in counterpart Japanese Patent Application No. 2011-218633, with English translation (8 pages).

Oka et al., "Study on free-surface flow of liquid lithium (2), Simulation of boundary layer flow inside nozzle in IFMIF", Proceedings of Fall Meeting of the Atomic Energy Society of Japan, Sep. 2, 2011, p. 788, vol. 2011 (1 page); cited in Decision to Grant a Patent dated Aug. 11, 2015 and Japanese Office Action dated Jun. 2, 2014.

\* cited by examiner

LIQUID METAL TARGET FORMING APPARATUS

BACKGROUND OF THE INVENTION

1. Field of the Invention

The present invention relates to a liquid metal target forming apparatus that forms a liquid metal target by a flow of liquid metal such as liquid lithium.

2. Description of the Related Art

FIG. 13 is a configuration diagram illustrating an example of a related liquid metal loop. FIG. 14 is an explanatory diagram illustrating a discharge port of a nozzle of the liquid metal loop illustrated in FIG. 13. A liquid metal loop 500 includes a target 501 used to obtain a neutron by irradiating with a proton beam, a quench tank 502 disposed at a downstream side of the target 501, a circulating pump 503 including an electromagnetic pump connected to the quench tank 502, and a heat exchanger 504 disposed at a downstream side of the circulating pump 503. The target 501 pushes liquid lithium toward a curving back wall 505 made of SUS 304 using centrifugal force, and forms a liquid lithium film flow on the back wall 505. The target 501 includes a nozzle that ejects liquid lithium. As illustrated in FIG. 14, a discharge port 506 of the nozzle has a reed shape including a long side 507 and a short side 508. An upper portion of the long side 507 forms a free liquid level of the target, and the long side 507 is machine processed in a predetermined surface roughness to form a smooth free liquid level.

A diameter of the back wall 505 is about 250 mm, a maximum flow velocity of liquid lithium is 20 m/s, and the liquid lithium is inhibited from boiling by a pressure due to centrifugal force. Liquid lithium has a film thickness of about 25 mm, and a width of about 260 mm. When an accelerator causes a proton to collide with liquid lithium flowing on the back wall 505, a neutron is generated behind liquid lithium. The neutron penetrates the back wall 505, and the rear of the back wall is irradiated with the neutron.

When causing liquid lithium to flow on the back wall 505, it is devised so that a wave of the free liquid level is suppressed to a predetermined value or less. In a document D1 (IFMIF experimental study related to liquid metal lithium target flow, Horiike, Kondou, Kanamura et al., J. Plasma Fusion Res. Vol. 84, No. 9 (2008) 600-605), water is sprayed at different velocities on a back wall substantially horizontally disposed as an experimental device, and a state of the free surface wave is observed. A shape of a discharge port of a nozzle is a rectangle having a width of 70 mm, and a height of 10 mm. The free surface wave is photographed using a stroboscope by a CCD camera. As a result, it confirms that a wave is not generated at a flow velocity of 3.0 m/s, a small wave is generated at a flow velocity of 5.0 m/s or more, and an irregular wave appears on the entire free surface at a flow velocity of 9.0 m/s or more. Referring to a measurement result at the center of a flow passage, the height of the wave is within 1 mm even at a high flow velocity.

When an irradiation area which is irradiated with a proton beam on a target may be increased, neutron generation efficiency is improved. However, as disclosed in a document D2 (Japanese Laid-open Patent Publication No. 2002-64000), in a method of forming a film flow of liquid lithium by causing liquid lithium to flow at a high speed on the curving back wall 505, centrifugal force acts such that a free liquid level of liquid lithium sprayed from a rectangular nozzle becomes smooth. In addition, in an experiment of D1 which presumes that liquid lithium flows on a back wall, it confirms that a wave generated on a free surface of a lithium flow at a high speed is suppressed to 1 mm or less. In both cases, it is difficult to increase an irradiation area of a proton beam in a target. The invention is conceived to solve the problems.

SUMMARY OF THE INVENTION

According to a first aspect of the present invention, there is provided a liquid metal target forming apparatus, including a nozzle that forms a liquid metal target in space, which is irradiated with a proton beam, by ejecting liquid metal thereto, wherein a portion where a region that receives a proton beam of the liquid metal target is formed in a discharge port of the nozzle has a concavo-convex shape.

According to a second aspect of the present invention, there is provided a liquid metal target forming apparatus, including a nozzle that forms a liquid metal target in space, which is irradiated with a proton beam, by ejecting liquid metal thereto, wherein a portion where a region that receives a proton beam of the liquid metal target is formed in a discharge port of the nozzle has a curve form or an oblique line form.

According to a third aspect of the present invention, there is provided a liquid metal target forming apparatus, including a nozzle that forms a liquid metal target in space, which is irradiated with a proton beam, by ejecting liquid metal to the space, wherein a plurality of holes is continuously provided in a travelling direction of a proton beam to have a plurality of steps in a discharge port of the nozzle, and holes of each step overlap each other in the travelling direction of a proton beam.

According to a fourth aspect of the present invention, there is provided a liquid metal target forming apparatus, including a nozzle that forms a liquid metal target in space, which is irradiated with a proton beam, by ejecting liquid metal thereto, wherein a parallel passage is formed by a discharge port of the nozzle.

According to a fifth aspect of the present invention, there is provided a liquid metal target forming apparatus, including a nozzle that forms a liquid metal target in space, which is irradiated with a proton beam, by ejecting liquid metal thereto, wherein a gas feed opening communicating with the inside of the nozzle is provided.

According to a six aspect of the present invention, there is provided a liquid metal target forming apparatus, including a nozzle that forms a liquid metal target in space, which is irradiated with a proton beam, by ejecting liquid metal in a membrane shape thereto, wherein an upward surface is provided in an edge portion of a long side portion of a discharge port of the nozzle.

DETAILED DESCRIPTION OF THE PREFERRED EMBODIMENTS (First Embodiment)

Figure 1:
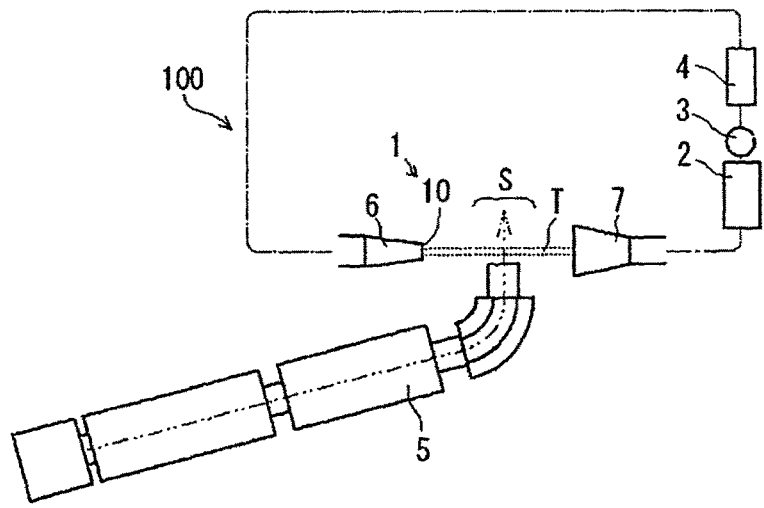
FIG. 1 is a configuration diagram illustrating a liquid metal loop according to a first embodiment of the invention.
Figure 2:
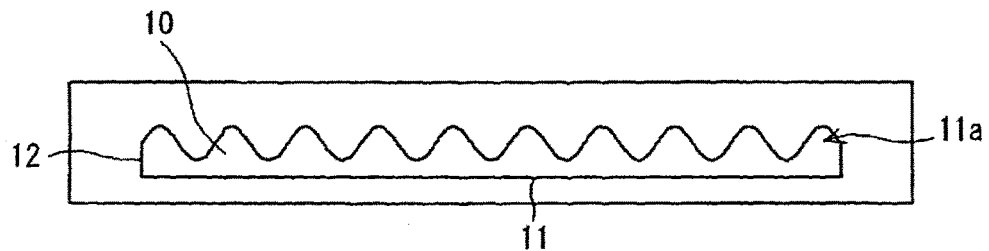
FIG. 2 is an explanatory diagram illustrating a nozzle of a liquid metal target forming apparatus.

FIG. 1 is a schematic diagram illustrating a target forming apparatus of a liquid metal loop according to a first embodiment of the invention. FIG. 2 is an explanatory diagram illustrating a nozzle of a liquid metal target forming apparatus. A liquid metal loop 100 includes a target forming apparatus 1 that forms a target including a jet of liquid lithium, a quench tank 2 connected to the target forming apparatus 1, a pump 3 connected to the quench tank 2, and a heat exchanger 4 connected to the pump 3. Equipment connected to the liquid metal loop 100 is not limited thereto. In addition, an accelerator 5 that irradiates a liquid lithium target T with a proton beam is disposed in front of the target forming apparatus 1.

The target forming apparatus 1 includes a nozzle 6 that sprays liquid lithium to a membrane so as to traverse a region S which is irradiated with a proton beam, and a receiving portion 7 including a diffuser that receives the sprayed liquid lithium. The nozzle 6 includes a reed-shaped discharge port 10 formed at a front edge of the nozzle, and liquid lithium sprayed from the discharge port 10 at a high pressure is a jet of a membrane. The liquid lithium as the jet is buffered by the receiving portion 7.

As illustrated in FIG. 2, the discharge port 10 of the nozzle 6 has a reed shape, and one side 11a of a long side 11 has a concavo-convex shape of a waveform. When the discharge port 10 has a shape illustrated in the drawing, the nozzle 6 may have a configuration penetrating a single plate, and may include a plurality of members. A shape and a size of the discharge port 10 of the nozzle 6 are determined based on an amount of energy of a proton beam, a heat capacity of liquid lithium, and the like. When a liquid lithium target T is irradiated with a proton beam, liquid lithium is heated due to the energy. For this reason, a flow rate of liquid lithium is controlled based on a heat capacity in an area which is irradiated with a proton beam of liquid lithium so that liquid lithium does not boil. When the concavo-convex shape is formed on a surface where a region that receives at least a proton beam is formed, the others may have a linear shape.

For example, the discharge port 10 of the nozzle 6 has a concavo-convex shape of which the long side 11 is 70 mm, a short side 12 is 2 to 5 mm, the amplitude is 1 to 2 mm, and the wavelength is several mm. The concavo-convex shape of the nozzle 6 has a greater surface roughness when compared to a case in which at least the long side 11 of the nozzle 6 has a normal straight line. That is, in contrary to smoothing a surface roughness (center line average roughness Ra) to 6.3 a to 0.13 a by machine processing such as polishing, the concavo-convex shape of the nozzle 6 has a surface roughness (center line average roughness Ra) of 12.5 a or more, preferably 50 a or more to actively form an irregularity.

From another point of view, the waveform corresponds to a standing wave or a ship wave actively formed on a free liquid level of liquid lithium, and is different from a wave when the wave is inactively generated. When a large wave is formed by the nozzle 6 of the invention where a minute wave is generated according to a flow velocity on a free liquid level as illustrated in D1, a further minute wave is formed on a surface of the wave.

From still another point of view, a standing wave is formed on a free liquid level of liquid lithium even at a low flow velocity. As disclosed in D1, when a speed of a flow of liquid lithium is low, a smooth free liquid level is generated, and thus a waveform is provided in a shape of the nozzle, and an irregularity may be formed on the free liquid level even in a low speed range. In addition, a small standing wave of about 1 mm may be formed even in a low speed range.

Figure 3:
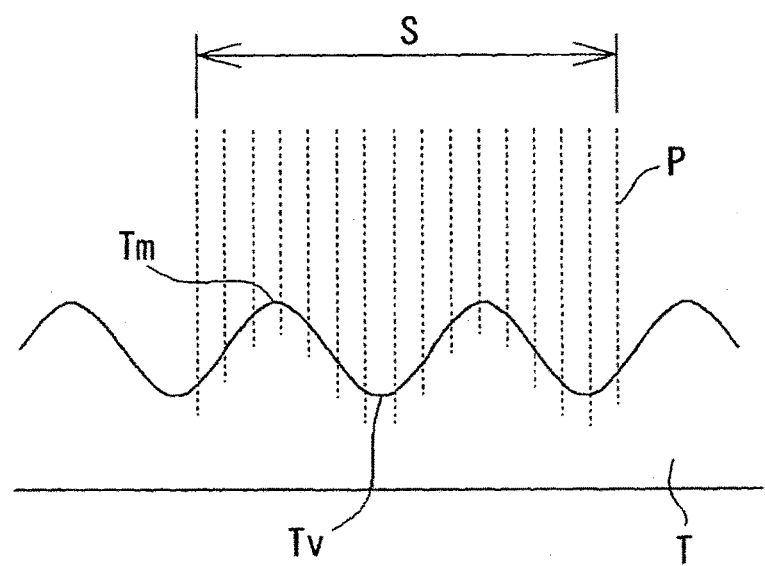
FIG. 3 is a schematic diagram illustrating an irradiation state of a proton beam with respect to a liquid lithium target formed by the nozzle.

FIG. 3 is a schematic diagram illustrating an irradiation state of a proton beam with respect to a liquid lithium target formed by the nozzle. A jet of liquid lithium sprayed from the nozzle 6 is sprayed to a membrane according to a shape of the nozzle 6, and forms the liquid lithium target T. Since the long side 11 of the nozzle 6 has a waveform, a standing wave surface having a zinc plate shape corresponding to the waveform is formed on a surface of the liquid lithium target T (region S that receives a proton beam). A direction of a crest Tm or a trough Tv of the standing wave is a direction of the spray. A maximum velocity of the liquid lithium jet is 20 m/s. For this reason, a waveform of a long side portion of the nozzle 6 is formed as a standing wave of a free liquid level.

The free liquid level of the standing wave has a greater surface area when compared to a smooth free liquid level. When the free liquid level is irradiated with a proton beam P, a proton collides with lithium to generate a neutron. Energy decreases when the proton beam P passes through lithium, and a neutron is difficult to be generated when the energy is less than a threshold value of a nuclear reaction. For this reason, a neutron is mainly generated near the surface of the liquid lithium target. In the invention, neutron generation efficiency may be enhanced by increasing a surface area of a region that receives the proton beam P by generating a standing wave on a free liquid level.

In addition, a heat capacity is determined based on a cross-sectional area and a flow rate of the liquid lithium target T. Since liquid lithium has a melting point of about 18° C., a thickness and a speed of the liquid lithium target T are needed to be determined so that liquid lithium is difficult to evaporate. In particular, since a heat capacity is small in the vicinity of the convex crest easily boiling, it is preferable that a flow velocity be controlled so as to prevent evaporation near the crest of the wave.

In this way, neutron generation efficiency may be dramatically enhanced by forming a standing wave on a free liquid level of the liquid lithium target T to actively increase a surface area.

Figure 4:
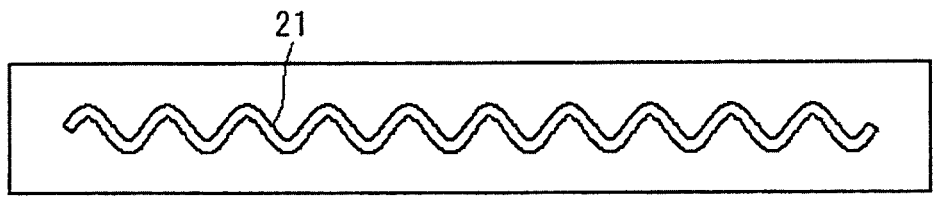
FIG. 4 is an explanatory diagram illustrating another example of a nozzle shape of the liquid metal target forming apparatus.

FIG. 4 is an explanatory diagram illustrating another example of a nozzle shape of the liquid metal target forming apparatus. In a nozzle 20, the entire shape of a discharge port 21 is a waveform. Since an area of a region that receives a proton beam similarly increases even in the nozzle 20 having a shape of the discharge port 10, neutron generation efficiency is enhanced. Since the nozzle 20 has a small heat capacity when compared to a nozzle shape illustrated in FIG. 2, it is preferable that a heat capacity be ensured by increasing a flow velocity. A concavo-convex shape of a waveform of the nozzle 20 corresponds to a size or a processing accuracy similar to that of FIG. 2.

Figure 5:
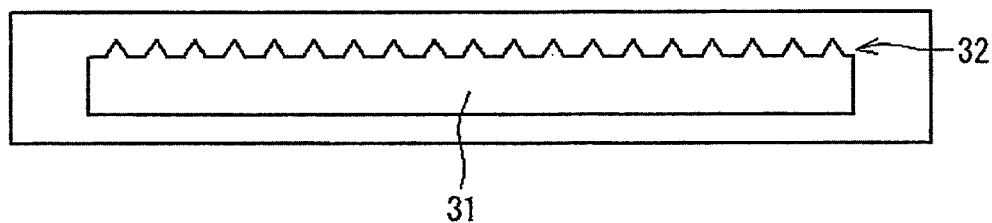
FIG. 5 is an explanatory diagram illustrating still another example of a nozzle shape of the liquid metal target forming apparatus.

FIG. 5 is an explanatory diagram illustrating still another example of a nozzle shape of the liquid metal target forming apparatus. In this way, a concavo-convex shape of a long side 32 of a discharge port 31 of a nozzle 30 may be formed in a serration. In the shape, a free liquid level of the liquid lithium target T may be formed in a concavo-convex shape by a standing wave. The concavo-convex shape of a waveform of the nozzle 30 corresponds to a size or a processing accuracy similar to that of FIG. 2. In addition to the serration, a similar effect is obtained even when a projection is formed in a comb shape.

(Second Embodiment)

Figure 6:
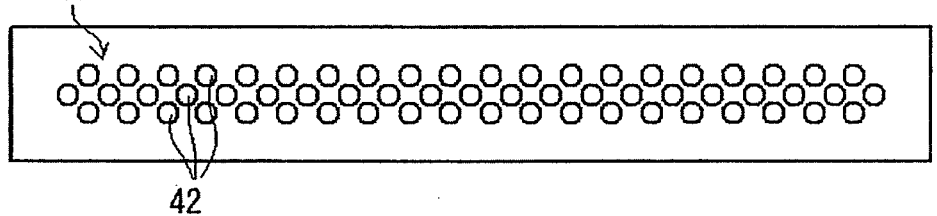
FIG. 6 is an explanatory diagram illustrating a nozzle according to a second embodiment of the invention.
Figure 7:
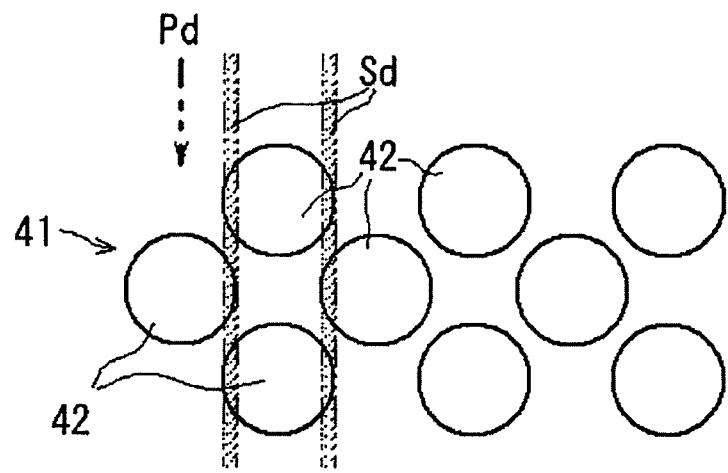
FIG. 7 is a partially enlarged view of a discharge port of a nozzle.

FIG. 6 is an explanatory diagram illustrating a nozzle according to a second embodiment of the invention. FIG. 7 is a partially enlarged view of a discharge port of a nozzle. A discharge port 41 of a nozzle 40 is characterized in that a plurality of circular small holes 42 is consecutively connected in a long side direction and a short side direction of the nozzle 40. For example, three lines of the small holes 42 are formed in a longitudinal direction, and are provided so as to be displaced from a neighboring line. In the drawing, the small holes 42 of an upper step and the small holes 42 of a middle step are disposed to overlap each other in a travelling direction Pd of a proton beam (overlapping region Sd in the drawing). The small holes of the middle step and the small holes 42 of a lower step are similarly disposed. This prevents a proton beam from penetrating a liquid lithium target. The small holes 42 of the lower step may be omitted.

It is preferable that the small holes 42 range in diameter from 2 mm to 3 mm. It is preferable that a gap between the small holes 42 of the upper step and the small holes 42 of the middle step in a travelling direction of a proton beam be a gap in which a proton does not penetrate even when the gap is irradiated with a proton beam at a slightly oblique angle.

According to a shape of the discharge port 41 of the nozzle 40, a concavo-convex shape is approximately formed in a region that receives a proton beam by the small holes 42, and the concavo-convex shape of the free liquid level sharply appears, and thus a surface area of the region that receives a proton beam dramatically increases. For this reason, neutron generation efficiency improves.

(Third Embodiment)

Figure 8A:
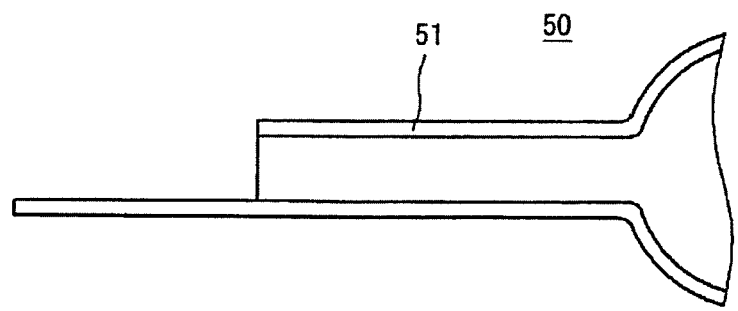
FIGS. 8A-B are explanatory diagrams illustrating a nozzle according to a third embodiment of the invention.
Figure 8B:
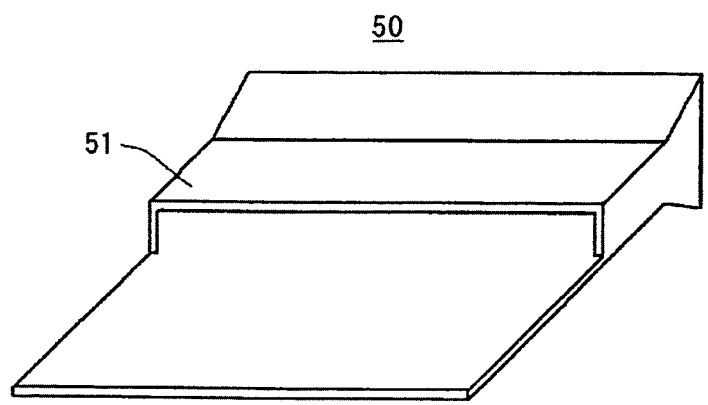
Figure 9:
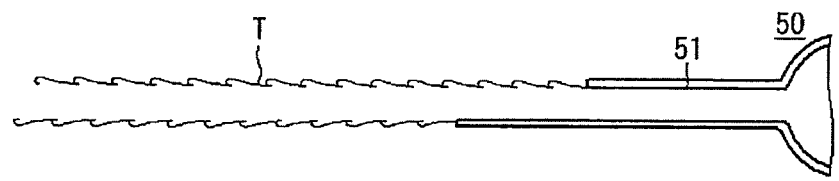
FIG. 9 is an explanatory diagram illustrating a target formed by the nozzle illustrated in FIG. 8.

FIG. 8 is an explanatory diagram illustrating a nozzle according to a third embodiment of the invention, FIG. 8(a) is a cross-sectional view, and FIG. 8(b) is a perspective view. FIG. 9 is an explanatory diagram illustrating a target formed by the nozzle illustrated in FIG. 8. A nozzle 50 is characterized in that a discharge port 51 of the nozzle 50 is a parallel passage. In the nozzle 50, a concavo-convex shape is formed on a free liquid level of a liquid lithium target T when ejected from the discharge port 51 by developing a boundary layer within the parallel passage. The concavo-convex shape irregularly appears on the free liquid level of the liquid lithium target T. For this reason, a surface area of a region that receives a proton beam increases when compared to a smooth free liquid level, and thus neutron generation efficiency improves.

In addition, a protrusion that makes a flow fluctuate may be provided on an upper surface on an inner side of a member which forms a nozzle. In this way, an irregularity is formed on a free liquid level when a disturbed flow generated by the protrusion inside of the parallel passage is ejected from the discharge port. In this case, since the concavo-convex shape irregularly appears on the free liquid level of the liquid lithium target T, a surface area of a region that receives a proton beam increases, and thus neutron generation efficiency improves. In addition, when a concavo-convex shape may be formed in the region that receives a proton beam, a plurality of protrusions may be provided on a lower surface on the inside.

(Fourth Embodiment)

Figure 10:
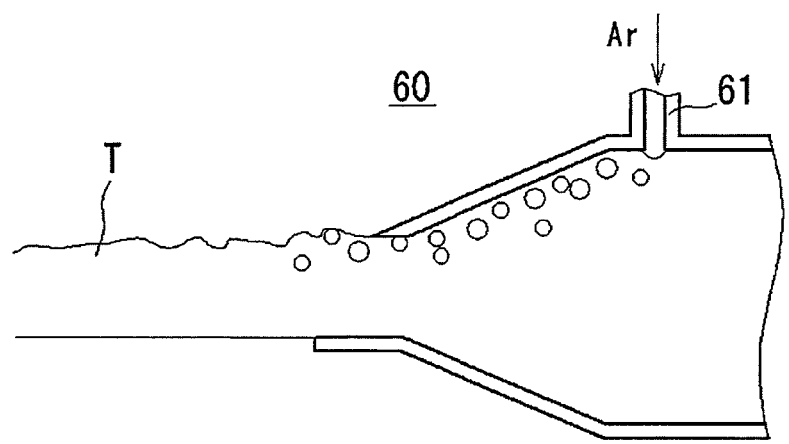
FIG. 10 is a cross-sectional view illustrating a nozzle according to a fourth embodiment of the invention.

FIG. 10 is a cross-sectional view illustrating a nozzle according to a fourth embodiment of the invention. A nozzle 60 is characterized in that a feed opening 61 of argon gas is provided at an upstream side of a diaphragm of the nozzle 60. When argon gas is introduced in a flow of liquid lithium from the feed opening 61, a pseudo-separated flow is generated, so that a free liquid level greatly fluctuates and an irregular concavo-convex shape is formed due to a two-fluid fluctuation and a rapid degasification to a vacuum after a discharge. Argon gas is sucked by a vacuum exhaust unit (not illustrated). In this way, a surface area thereof increases when compared to a smooth free liquid level, and thus neutron generation efficiency is enhanced.

(Fifth Embodiment)

Figure 11:
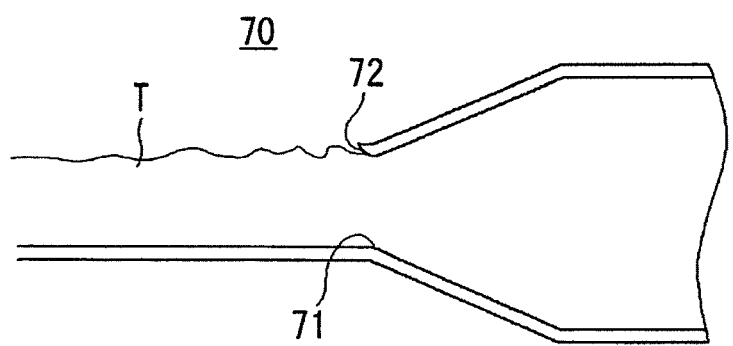
FIG. 11 is a cross-sectional view illustrating a nozzle according to a fifth embodiment of the invention.

FIG. 11 is a cross-sectional view illustrating a nozzle according to a fifth embodiment of the invention. In a nozzle 70, a smooth upward curved surface portion 72 is attached to an edge portion in a long side portion of a discharge port 71 of the nozzle 70. In this case, since liquid lithium is lifted along the curved surface portion 72 of the discharge port 71, a free liquid level is unstable to fluctuate. In this way, a surface area thereof increases when compared to a smooth free liquid level, and thus neutron generation efficiency is enhanced.

(Sixth Embodiment)

Figure 12A:
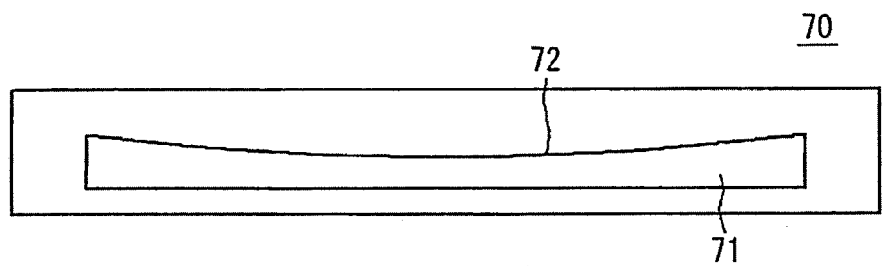
FIGS. 12A-B are explanatory diagrams illustrating a nozzle according to a sixth embodiment of the invention.
Figure 12B:
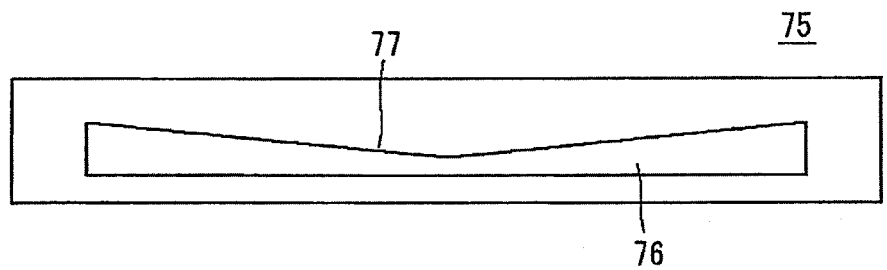
Figure 13:
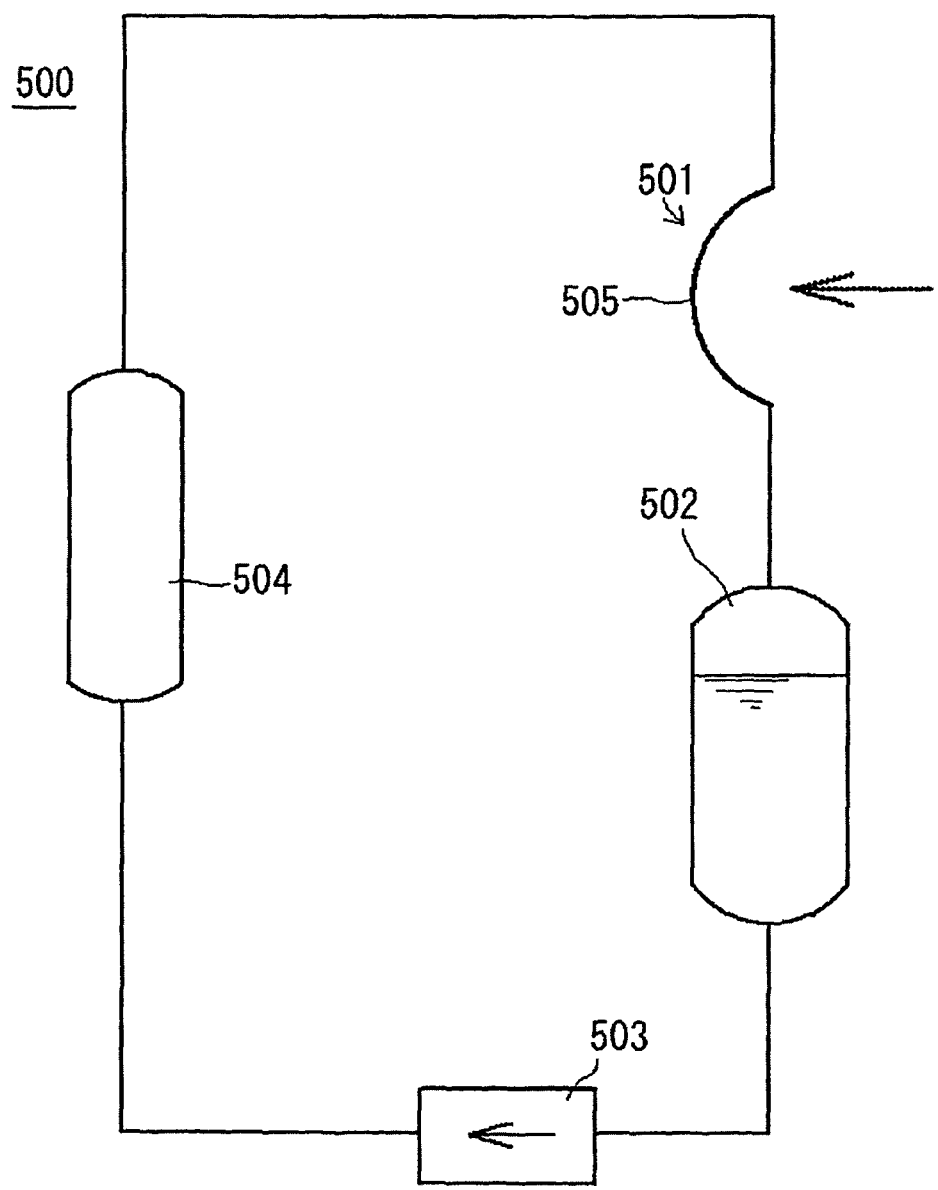
FIG. 13 is a configuration diagram illustrating a conventional liquid metal loop.
Figure 14:
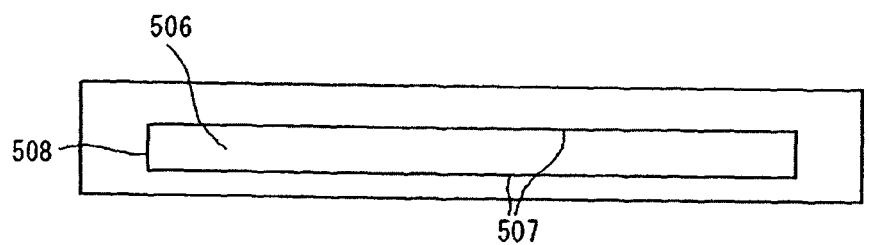
FIG. 14 is an explanatory diagram illustrating a discharge port of a nozzle of the conventional liquid metal loop.

FIG. 12 is an explanatory diagram illustrating a nozzle according to a sixth embodiment of the invention. As illustrated in FIG. 12(a), a long side portion 72 of a discharge port 71 of a nozzle 70 may have a curve form as a whole. In addition, as illustrated in FIG. 12(b), a long side portion 77 of a discharge port 76 of a nozzle 75 may be a letter V shaped oblique line form. In both cases, a free liquid level is obliquely formed with respect to an irradiation direction of a proton beam, and thus a surface area of a region that receives a proton beam increases, and neutron generation efficiency is enhanced.

In the first embodiment of the present invention, since liquid metal is ejected to irradiation space of a proton beam through the nozzle to form a liquid metal target, it is possible to stably form a concavo-convex shape in a region that receives a proton beam of a liquid metal target without an influence of centrifugal force. Accordingly, an area of a region that receives a proton beam increases, and neutron generation efficiency is improved. The concavo-convex shape includes a waveform, a comb shape, a tooth shape, and the like.

The liquid metal target forming apparatus actively forms a concavo-convex shape on a proton beam irradiation surface of a liquid metal target, and the concavo-convex shape is greater than a minute wave on a free liquid level of on the liquid metal target ejected from a discharge port formed in a straight line, and therefore a surface area increases and thus neutron generation efficiency can be improved.

A discharge port of a normal nozzle forms a surface having a surface roughness of 6.3 a or less by machine processing to form a smooth surface. In the invention, in contrary to the normal nozzle described above, a concavo-convex shape is formed on a free liquid level of a liquid metal target by increasing a surface roughness. Accordingly, a region that receives a proton beam increases, and neutron generation efficiency may be further enhanced.

In the first embodiment of the present invention, a "standing wave" is a wave having a constant shape.

The concavo-convex shape generates a standing wave or a ship wave on a surface of a liquid metal target, and is different from an irregular wave that is naturally generated. A surface area of a liquid metal target increases by the standing wave or the ship wave, thereby improving neutron generation efficiency.

In the second embodiment of the present invention, when liquid metal is sprayed from a plurality of holes of the discharge port, a liquid metal target is formed in which a free liquid level has a concavo-convex shape in a membrane on the whole. Since holes of respective steps are disposed to overlap each other in a vertical direction, liquid metal sprayed from each hole has no void in the vertical direction. Accordingly, a surface area of a liquid metal target increases, and neutron generation efficiency may be further enhanced.

In the third embodiment of the present invention, when a boundary layer develops within a parallel passage, thereby spraying liquid metal from a discharge port, fluctuation occurs in a free liquid level, and an irregular concavo-convex shape is formed. Accordingly, a surface area of a free liquid level increases, and neutron generation efficiency is improved.

In the fourth embodiment of the present invention, for example, when argon gas is introduced from the gas feed opening, a free liquid level greatly fluctuates and an irregular concavo-convex shape is formed due to a two-fluid fluctuation and a rapid degasification to a vacuum. Accordingly, a surface area of a free liquid level increases, and neutron generation efficiency is improved.

In the fifth embodiment of the present invention, for example, since liquid lithium is lifted along a curved surface portion of the discharge port, a free liquid level is unstable and to fluctuate. Accordingly, a surface area of a free liquid level of a liquid metal target increases, and neutron generation efficiency is improved.

The invention claimed is:

1. A neutron generator, comprising
an accelerator that irradiates with a proton beam,
a nozzle that forms a liquid metal target in space, which is irradiated with the proton beam, by ejecting liquid metal thereto,
a receiving portion that faces the nozzle, the receiving portion receives the liquid metal target from the nozzle,
a portion which forms a part of a region in a discharge port of the nozzle has an elongated shape wherein at least one long side of the discharge port of the nozzle has a cyclical concavo-convex shape; wherein
generating neutrons by receiving the proton beam between the nozzle and the receiving portion at least in the part of the region where the liquid metal target is formed,
the nozzle ejects the liquid metal target to the receiving portion linearly, and
wherein a wave surface of the liquid metal target forms a concavo-convex shape corresponding to the concavo-convex shape of the discharge port of the nozzle, and the liquid metal is liquid lithium.

2. The neutron generator according to claim 1, wherein
a minute wave is generated on a free liquid level of the concavo-convex shaped wave surface, and
a difference in height of the concavo-convex shape of the discharge port of the nozzle is greater than a wave height of the minute wave.

3. The neutron generator according to claim 1, wherein the concavo-convex shape of the discharge port is a concavo-convex shape which generates a standing wave or a ship wave in a region that receives the proton beam of the liquid metal target formed by ejecting liquid metal.

4. The neutron generator according to claim 1, wherein the concavo-convex shape is a waveform, a comb shape, or a serration.

5. The neutron generator according to claim 1, further comprising:
a quench tank connected to the nozzle and the receiving portion, and
a pump connected to the quench tank; wherein
the nozzle, the receiving portion, the quench tank and the pump form a liquid metal loop in which the liquid metal circulates.

6. The neutron generator according to claim 1, wherein an ejection velocity of the liquid metal is equal or more than 3.0 m/s and equal to or less than 20 m/s.

7. The neutron generator according to claim 6, wherein the nozzle ejects the liquid metal with disturbed flow.

* * * * *